United States Patent [19]

Merlo et al.

[11] Patent Number: 4,801,816
[45] Date of Patent: Jan. 31, 1989

[54] GENERATOR OF PERIODIAL SIGNALS, IN PARTICULAR FOR SWITCH-MODE POWER SUPPLIES

[75] Inventors: Mauro Merlo, Villasanta; Silvano Coccetti, Vittuone, both of Italy

[73] Assignee: SGS-Thomson Microelectronics S.p.A., Catania, Italy

[21] Appl. No.: 158,811

[22] Filed: Feb. 22, 1988

[30] Foreign Application Priority Data

Feb. 25, 1987 [IT] Italy ................ 19492 A/87

[51] Int. Cl.$^4$ ........................................ H03K 4/48
[52] U.S. Cl. ................................ 307/228; 328/184
[58] Field of Search ............... 307/228, 261; 328/35, 328/181, 182, 183, 184

[56] References Cited

U.S. PATENT DOCUMENTS 2,983,831  5/1961  Walton .......................... 307/228
4,413,237 11/1983  Baba ............................. 307/228

FOREIGN PATENT DOCUMENTS 57326   5/1981  Japan ........................... 307/261
474921 10/1975  U.S.S.R. ...................... 307/228

OTHER PUBLICATIONS

Dobratz et al, "Simple Ramp Generator Uses Five Components", Elect. Design 5, p. 83, Mar. 1, 1970.

Primary Examiner—William H. Beha, Jr.
Attorney, Agent, or Firm—Guido Modiano; Albert Josif

[57] ABSTRACT

This generator of periodic signals with exponential edges, which may be integrated at low cost, comprises a current source circuit connected to a capacitor and to a resistive element to supply them with currents having mutually correlated amplitudes, an amplifier interposed between the capacitor and the resistive element and adapted to maintain the voltage drop on the resistive element proportional to the voltage drop on the capacitor, and a switch device, connected in parallel to the capacitor and periodically switched off to allow the discharge of the capacitor.

6 Claims, 1 Drawing Sheet

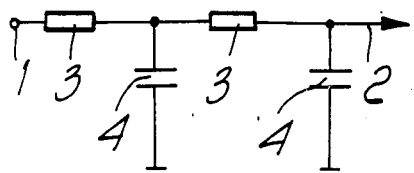
Fig.1
PRIOR ART
Fig.2b
Fig.2a
PRIOR ART
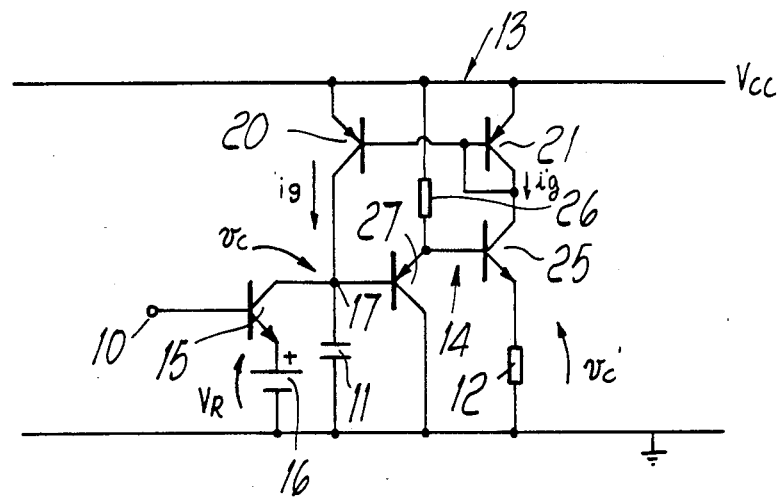
Fig.3
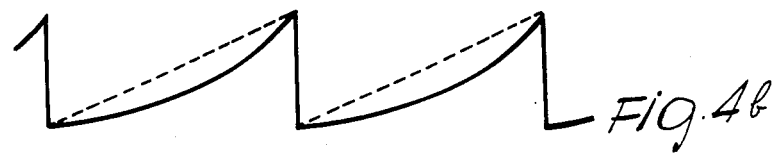
Fig.4b
Fig.4a

GENERATOR OF PERIODIAL SIGNALS, IN PARTICULAR FOR SWITCH-MODE POWER SUPPLIES

BACKGROUND OF THE INVENTION

The present invention relates to a generator of periodic signals, in particular for switch-mode power supplies.

As is known, switch-mode power supplies generally employ amplitude modulation (PWM) circuits substantially comprise a voltage comparator which compares a periodic signal with an error signal. Generally said periodic signal is a saw-tooth signal, but in particular applications, for example in vertical switching deflection circuits for the control of a screen, it is necessary to have a signal with exponential raising fronts or edges; this in fact allows to eliminate, or at least attenuate, the cross-over distortion which appears as an intensification of the brightness at the center of the screen.

For the obtainment of periodic signals with such an exponential plot, a discrete device is known comprising a ladder-like circuit including resistors and capacitors. Said known circuit is illustrated by way of example in FIG. 1 and, for an input voltage as illustrated in FIG. 2a, allows to achieve at the output the voltage illustrated in FIG. 2b.

The known solution, however, is not usable in the case of integrated circuits due to the high cost required for its manufacture. In fact it uses two or more capacitors, the integration whereof entails hardly negligible costs, and furthermore, when the capacitors are externally connected, would require the use of at least two pins of the integrated circuit, sometimes requiring the use of larger packages, further increasing the cost of the complete circuit.

SUMMARY OF THE INVENTION

Given this situation, the aim of the present invention is to provide a generator of periodic signals with exponential edges, in particular for switch-mode power supplies, which eliminates the disadvantages of the prior art, and in particular can be easily integrated.

Within this aim, a particular object of the present invention is to provide a generator of periodic signals the integration costs whereof are reduced by virtue of the use of a single capacitor, connectable from outside or even integratable.

Another object of the present invention is to provide a generator of periodic signals which needs a single pin of the integrated circuit comprising the signal generator and has a reduced area use.

Not least object of the present invention is to provide a generator of periodic signals which has a very simple and reliable structure for the obtainment of the desired exponential signal.

This aim, the objects mentioned and others which will become apparent hereinafter, are achieved by a generator of periodic signals, in particular for switch-mode power supplies, as defined in the accompanying claims.

BRIEF DESCRIPTION OF THE DRAWINGS

The advantages and characteristics of the invention will become apparent from the description of a preferred but not exclusive embodiment, illustrated only by way of non-limitative example in the accompanying drawings, wherein:

FIG. 1 is the circuit diagram of a known solution;

FIGS. 2a and 2b illustrate the plot of two signals related to the known circuit of FIG. 1;

FIG. 3 is an exemplifying circuit diagram of the invention; and

FIGS. 4a and 4b illustrate the plot of two signals related to the circuit according to the invention.

DESCRIPTION OF THE PREFERRED EMBODIMENTS

With reference to FIG. 1, the circuit diagram of a known generator of periodic signals with exponential edges is illustrated therein.

As can be seen, the circuit substantially comprises a ladder-like network having an input pin 1 and an output pin 2 and having resistors 3 and capacitors 4. By applying on the input 1 the control signal, illustrated in FIG. 2a, the output signal, on the pin 2, has the plot illustrated in FIG. 2b, from which it is apparent that, upon the arrival of a negative pulse on the input 1, the capacitor 4 instantaneously discharge, while, when the input 1 returns high, the capacitors begin to load with exponential behaviour.

Reference should now be made to FIG. 3, illustrating an example of the generator of periodic signals according to the invention.

As can be seen, the generator comprises a capacitor 11 and a resistor 12 supplied by a current mirror circuit indicated at 13, which feeds the capacitor and the resistor with mutually correlated current. Between the capacitor 11 and the resistor 12 an amplifier circuit 14 is arranged, which maintains a proportionality, and precisely the equality, between the drop across the capacitor 11 and the drop across the resistor 12. The circuit, in its general structure, furthermore comprises a switch comprising here a transistor 15 the base terminal whereof constitutes the input 10 of the circuit to which pulses are fed which cause the conduction of the same transistor 15 and the discharge of the capacitor 11.

In detail, the transistor 15, of the NPN type, has its emitter terminal connected to the positive pole of a constant voltage source 16 with value $V_R$, while its collector terminal is connected to a terminal 17 of the capacitor 11, connected with the other terminal to the ground. Said terminal 17 is connected to the current mirror circuit 13 formed by a first transistor 20 and by a second transistor 21, diode connected. In particular, the collector of the transistor 20 is connected to the terminal 17, the emitter of the transistor 20 is connected to the supply voltage, while its base is connected to the base of the transistor 21, having the emitter also connected to the supply voltage and the collector connected to the collector of a transistor 25 which is part of the amplifier 14. In turn, the transistor 25 has its emitter connected to a terminal of the resistor 12 (having the other terminal connected to the ground) and its base connected to the supply voltage through the resistor 26 and to the emitter of a further transistor 27 constituting, with the transistor 25, the amplifier. The transistor 27 is in turn connected with its base to the terminal 17 and with its collector to the ground.

The circuit illustrated in FIG. 3 operates as follows. The transistor 15 (receiving on the base 10 the signal illustrated in FIG. 4a) has the purpose of allowing the discharge of the capacitor 11 when its base is supplied with a pulse which causes said transistor to conduct.

Accordingly, by virtue of the conduction of the transistor 15, the capacitor 11 discharges down to the voltage $V_R$ supplied by the source 16. At the end of the pulse 4a, the transistor 15 is switched off, thus allowing charging of the capacitor 11 by means of the current $i_g$ supplied by the transistor 20 of the current mirror 13. Said current $i_g$ initially has the value $V_R/R$, R being the resistance of the resistor 12. In fact, by virtue of the connection of the transistors 25 and 27, the voltage $v_c'$ across the resistor 12 practically coincides with the voltage $v_c$ across the capacitor, while by virtue of the mirror 13 having ratio 1:1, the current flowing in the resistor 12 is also supplied to the capacitor 11. Accordingly the capacitor 11 starts to charge with increasing current, the value whereof is a function of the voltage on the capacitor, fed to the resistor 12 by the circuit 14. The voltage $v_c$ across the capacitor 11 increases until the new pulse on the input 10, which causes the new switching on of the transistor 15 and a new discharge of the capacitor 11. The equations which govern the system are as follows:

$$i_g'(t) = i_g(t) = \frac{v_c'}{R} = \frac{v_c}{R}$$

$$v_c(t) = \frac{1}{C} \int_o^t i_g(t) \, dt$$

where from:

$$v_c(t) = V_R \, e^{t/RC}$$

Accordingly, during the charging period of the capacitor, across the same capacitor, and across the resistor 12 connected so as to have the same voltage, an exponential voltage is present which can thus be used controlling amplitude modulation circuits of switching power supplies.

As can be seen from the preceding description, the invention fully achieves the proposed aim and objects. In fact a generator of signals with exponential edges has been provided which requires a single capacitor and which can be easily integrated. Said capacitor can be external or even integrated.

The generator exploits a single pin (pin 10) of the integrated circuit of which it is part, therefore not causing the use of packages with greater dimensions, and therefore allowing the containment of the costs of the integrated circuit as a whole.

The illustrated structure is furthermore extremely simple and therefore has per se very reduced manufacture costs which allow its wide application.

The invention thus conceived is susceptible to numerous modifications and variations, all within the scope of the inventive concept. In particular, though in the solution illustrated by way of example the current mirror operates so as to exactly mirror the current flowing in the resistor 12 towards the capacitor 11, it is possible to also use other current mirrors supplying to the capacitor 11 a current in a given ratio, different from 1, with respect to the current flowing in the resistor, obtaining in this case only a current in the capacitor no longer equal but proportional to the voltage on the capacitor 11.

Furthermore, though the circuit formed by the transistors 25 and 27 operates so as to exactly transfer the voltage at the input on the capacitor to output on the resistor, the use is conceivable of any other circuit capable of feeding the output resistor with a voltage proportional to the voltage on the capacitor 11, for example a voltage amplifier with gain greater or smaller than 1. In this case, therefore, the circuit will have the same behaviour illustrated, with the only difference that the output voltage will be amplified or reduced with respect to the voltage on the capacitor by a value equal to the gain of the intermediate stage.

Furthermore all the details may be replaced with other technically equivalent ones.

We claim:

1. A generator of periodic signals, in particular for switch-mode power supplies, comprising a capacitive element generating a capacitor voltage drop thereon, a resistive element generating a resistor voltage drop thereon, current source means connected to said capacitive element and to said resistive element and supplying them with currents having mutually proportional amplitudes, amplifier means, interposed between said capacitive element and said resistive element for maintaining the resistor voltage drop proportional to the capacitor voltage drop and a switch device, connected in parallel to said capacitive element, said switch device being periodically switched off for allowing discharge of said capacitive element therethrough.

2. A generator of periodic signals according to claim 1, wherein said current source means comprises a current mirror circuit having a first terminal connected to a terminal of said capacitive element and a second terminal connected to a terminal of said resistive element.

3. A generator of periodic signals according to claim 1, wherein said amplifier means have unit gain.

4. A generator of periodic signals according to claim 1, wherein said current source means have a first terminal connected to a terminal of said capacitive element and said switch device, and a second terminal connected to a terminal of said resistive element, and said amplifier means comprise a first and a second bipolar transistors alternately of the PNP type and of the NPN type, said first transistor being connected with its own base terminal to said terminal of said capacitive element and said first terminal of said current source, and said second transistor being connected with its own base terminal to the emitter terminal of said first transistor, with its own emitter terminal to said terminal of said resistive element and with its own collector terminal to said second terminal of said current source.

5. A generator of periodic signals according to claim 4, wherein said switch device comprise a third transistor connected with its own collector and emitter terminals between said terminal of said capacitive element and a reference voltage point and receiving on its base terminal control pulses for switching on said third transistor and electrically connecting said terminal of said capacitive element to said reference voltage point.

6. A generator of periodic signals according to claim 5, wherein said third transistor is of NPN type having its collector terminal connected to said terminal of said capacitive element and its emitter terminal connected to said reference potential point.

* * * * *